United States Patent
Kusunoki et al.

(10) Patent No.: US 11,411,369 B2
(45) Date of Patent: Aug. 9, 2022

(54) METHOD FOR MANUFACTURING SEMICONDUCTOR DEVICE

(71) Applicant: Mitsubishi Electric Corporation, Tokyo (JP)

(72) Inventors: Masatsugu Kusunoki, Tokyo (JP); Kyosuke Kuramoto, Tokyo (JP); Takehiro Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 202 days.

(21) Appl. No.: 16/965,578

(22) PCT Filed: Apr. 3, 2018

(86) PCT No.: PCT/JP2018/014216
§ 371 (c)(1),
(2) Date: Jul. 28, 2020

(87) PCT Pub. No.: WO2019/193643
PCT Pub. Date: Oct. 10, 2019

(65) Prior Publication Data
US 2021/0050706 A1    Feb. 18, 2021

(51) Int. Cl.
*H01S 5/0237* (2021.01)
*H01S 5/042* (2006.01)
*H01S 5/024* (2006.01)
*H01S 5/30* (2006.01)

(52) U.S. Cl.
CPC ........ *H01S 5/0237* (2021.01); *H01S 5/04256* (2019.08); *H01S 5/02469* (2013.01); *H01S 5/3013* (2013.01)

(58) Field of Classification Search
CPC ..................... H01S 5/0237; H01S 5/04256
See application file for complete search history.

(56) References Cited

U.S. PATENT DOCUMENTS

| 2006/0239318 A1 | 10/2006 | Kunimasa | |
| 2011/0249694 A1* | 10/2011 | Nishiguchi | H01S 5/0234 257/E33.056 |
| 2015/0263487 A1* | 9/2015 | Yamamoto | H01S 5/0234 372/44.01 |

FOREIGN PATENT DOCUMENTS

| JP | H05-190973 A | 7/1993 |
| JP | 2003-324228 A | 11/2003 |
| JP | 2006-303299 A | 11/2006 |
| JP | 2009-111080 A | 5/2009 |
| JP | 2011-222675 A | 11/2011 |

(Continued)

OTHER PUBLICATIONS

International Search Report; Written Opinion; and Notification of Transmittal of The International Search Report and the Written Opinion of the International Searching Authority, or the Declaration issued in PCT/JP2018/014216; dated Jun. 19, 2018.

(Continued)

*Primary Examiner* — Tuan N Nguyen
(74) *Attorney, Agent, or Firm* — Studebaker & Brackett PC

(57) ABSTRACT

A method for manufacturing a semiconductor device includes: heating solder to wetly spread toward a first end face or a second end face of a submount substrate under restriction on the wet spreading by a burr to form an extending part, so that the extending part directly connects a laser chip and a barrier layer.

14 Claims, 11 Drawing Sheets

(56) References Cited

FOREIGN PATENT DOCUMENTS

JP          2015-173218 A     10/2015

OTHER PUBLICATIONS

Office Action issued in JP 2018-545400; mailed by the Japanese Patent Office dated Oct. 9, 2018.
Office Action issued in JP 2018-545400; mailed by the Japanese Patent Office dated Dec. 11, 2018.

* cited by examiner

METHOD FOR MANUFACTURING SEMICONDUCTOR DEVICE

FIELD

The present invention relates to a method for manufacturing a semiconductor device.

BACKGROUND

In well-known optical modules, a barrier layer is provided between a submount electrode and solder that uses, for example, AuSn as a material and thereby the spreading of the solder is prevented. The material of the barrier layer is Pt. The effect of preventing wet-spreading of the solder can be obtained by avoiding the reaction between the solder and Au of the submount electrode by the barrier layer. In addition, it can be also considered that a burr generated at the time of lift-off in Pt pattern formation serves as a barrier to prevent the spread of the solder. By providing the barrier layer to prevent the spread of the solder, it is possible to avoid causing the solder to wetly spread over the entire submount and thereby being unable to secure a wire bonding area.

In Patent Document 1, it is disclosed that when an AuSn solder layer is melted, it does not react with an Au layer due to the presence of a Pt layer which is a barrier layer, and maintains characteristics as solder.

PRIOR ART

Patent Literature

[PTL 1] JP H5-190973

SUMMARY

Technical Problem

If solder is present up to an end of the submount, that is, a cutting line, a solder burr may occur at the time of cutting, which may lead to the deterioration of characteristics and the reduction of reliability. In order to prevent this, it is necessary that the solder is formed on an inner side than the end of the submount. That is, the solder is provided only in an area which is desired to be set back from an end face of the submount. In soldering a laser chip to the submount prepared in this way, the solder pressed under the laser chip easily travels in a direction different by 90° from that of a resonator where the solder is present; but does not easily travel in a direction of the resonator where the solder is absent. Therefore, there is a problem that the solder does not easily get wet on end faces of the laser chip and the heat dissipation is bad.

The present invention has been made in order to solve the above-mentioned problem and it is an object of the present invention to provide a method for manufacturing a semiconductor device in which while the wet spreading of the solder is prevented in a direction different from that of the resonator by 90° so as to secure a wire bonding area, the solder easily gets wet up to the end of the submount or its vicinity so as to improve the heat dissipation.

Means for Solving the Problems

According to a present invention, a method for manufacturing a semiconductor device includes preparing a submount, the submount including a submount substrate having a first end face and a second end face opposite to the first end face, an electrode layer provided on the submount substrate, a barrier layer provided on the electrode layer, the barrier layer extending to only at least one of the first end face and the second end face among end faces of the submount substrate in a plan view, a burr provided on a side face of the barrier layer and higher than the barrier layer, and solder provided on the barrier layer so as to be set back from all the end faces of the submount substrate in a plan view, placing a laser chip on the solder, the laser chip having a light emitting stripe region and adjacent regions on left and right of the light emitting stripe region, and positioning the laser chip directly above the first end face and directly above the second end face, and heating the solder to wetly spread toward the first end face or the second end face under restriction on the wet spreading by the burr to form an extending part, so that the extending part directly connects the laser chip and the barrier layer.

Other features will be disclosed below.

Advantageous Effects of Invention

The extending direction of the melted solder is restricted by the burr of the barrier layer and the solder is extended to a front end face side or a rear end face side of the laser chip, so that the solder can be wetly spread to the end of the submount or its vicinity while the wire bonding area is secured.

DESCRIPTION OF EMBODIMENTS

A method for manufacturing a semiconductor device according to embodiments will be described with reference to drawings. Identical or corresponding components are denoted by identical reference signs and repeated descriptions thereof may be omitted.

First Embodiment

Figure 1:
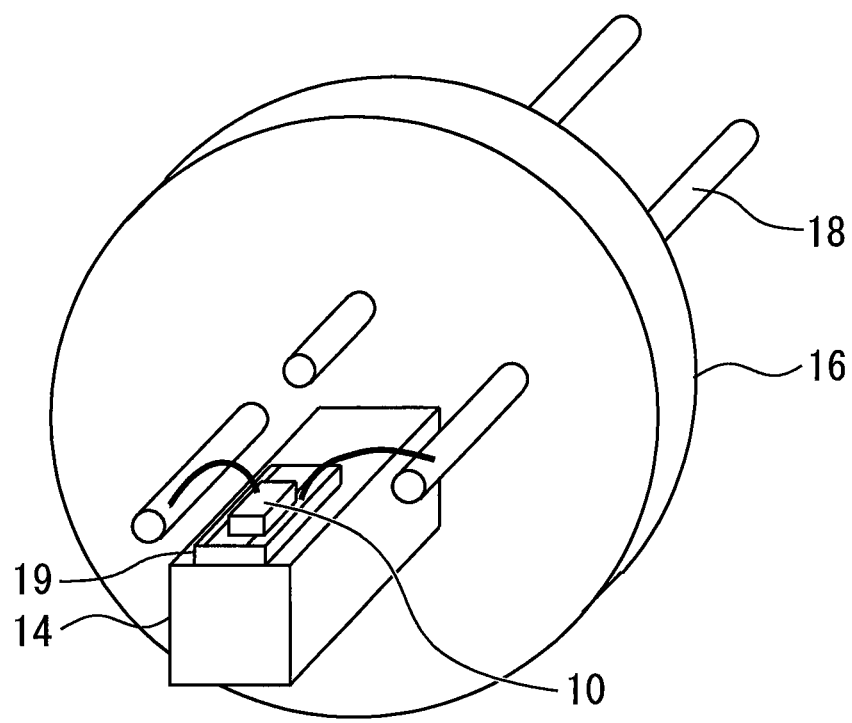
FIG. 1 is a perspective view of a semiconductor device.

FIG. 1 is a perspective view of a semiconductor device in a first embodiment. A laser chip 10 at least part of which is formed of a semiconductor is mounted on a submount 19. The submount 19 is mounted on a heat sink 14. The heat sink 14 is fixed to a stem 16. A terminal 18 penetrating through the stem 16 is provided in plurality. The terminals 18 and the laser chip 10 are electrically connected. For example, an upper face of the laser chip 10 and one of the terminals 18 are connected by a wire; and the submount 19 and another one of the terminals 18 are connected by another wire.

Figure 2:
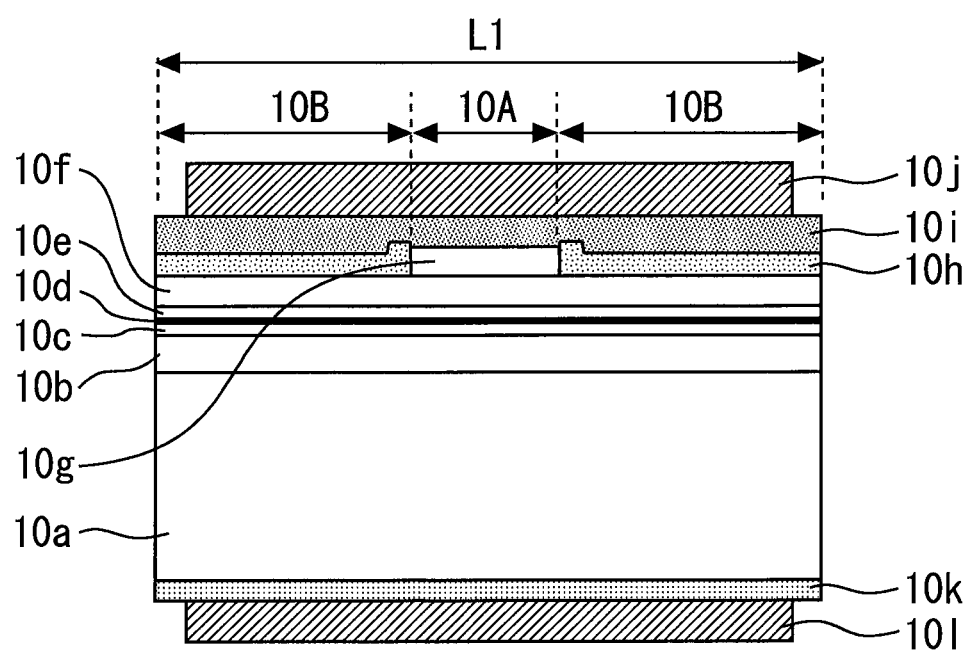
FIG. 2 is a cross-sectional view of the laser chip.

FIG. 2 is a cross-sectional view taken by cutting the laser chip 10 vertically with respect to a laser propagation direction. The laser chip 10 has a semiconductor substrate 10a. On the semiconductor substrate 10a, a lower cladding layer 10b made of an n-type AlInP is formed. The semiconductor substrate 10a and the lower cladding layer 10b are directly bonded. On the lower cladding layer 10b, a lower light guide layer 10c made of undoped AlInP is formed. On the lower light guide layer 10c, an active layer 10d made of GaInP is formed.

On the active layer 10d, an upper light guide layer 10e made of undoped AlGaInP is formed. On the upper light guide layer 10e, an upper cladding layer 10f made of p-type AlInP is formed. On the upper cladding layer 10f, a contact layer 10g made of p-type GaAs is formed.

The thickness of the semiconductor substrate 10a is 50 to 150 μm. The thickness of the lower cladding layer 10b is 0.5 to 4.0 μm. The carrier concentration of the lower cladding layer 10b is 0.5 to $1.5 \times 10^{18}$ cm$^{-3}$. The thickness of the lower light guide layer 10c and the upper light guide layer 10e is 0.02 to 0.4 μm. The thickness of the active layer 10d is 3.0 to 20 nm. The thickness of the upper cladding layer 10f is 0.5 to 4.0 μm. The carrier concentration of the upper cladding layer 10f is 0.5 to $2.0 \times 10^{18}$ cm$^{-3}$. The thickness of the contact layer 10g is 0.05 to 0.5 μm. The carrier concentration of the contact layer 10g is 1.0 to $4.0 \times 10^{19}$ cm$^{-3}$.

On a side of the contact layer 10g, an insulating film 10h such as a silicon nitride film is formed. In a light emitting region, that is, a region into which current is injected, the insulating film 10h is etched to have an opening. The contact layer except the opening part is removed by etching. On the contact layer 10g and the insulating film 10h, a p-side electrode 10i is formed. The p-side electrode 10i is one obtained by laminating thin films of Ti, Pt, Au, or the like. The thickness of the p-side electrode 10i is 0.05 to 1.0 μm. The contact layer 10g and the p-side electrode 10i are in low resistance junction through the opening of the insulating film 10h. On the p-side electrode 10i, a gold plated layer 10j is formed. The thickness of the gold plated layer 10j is 1.0 to 6.0 μm.

On a lower face of the semiconductor substrate 10a, an n-side electrode 10k is bonded. Under the n-side electrode 10k, a gold plated layer 10l is formed. The n-side electrode 10k is one obtained by laminating thin films of Ti, Pt, Au, or the like. The thickness of the n-side electrode 10k is 0.05 to 1.0 μm and the thickness of the gold plated layer 10l is 1.0 to 6.0 μm. The width L1 of the laser chip 10 is 1 to 400 μm.

The laser chip 10 has a light emitting stripe region 10A and adjacent regions 10B on left and right of the light emitting stripe region 10A. The light emitting stripe region 10A is a part where the contact layer 10g which is etched so as to leave only the light emitting stripe region is formed. The thickness of the light emitting stripe region 10A is 100 μm. It should be noted that the above mentioned materials and figures are intended to be illustrative and may be other materials and figures. Descriptions below are also illustrative and not restrictive.

The laser chip 10 is turned upside down and the p-side gold plated layer 10j is die-bonded on the submount 19. Then, it is wire-bonded on the gold plated layer 10l and current is supplied to the laser chip 10 through the wire.

Figure 3A:
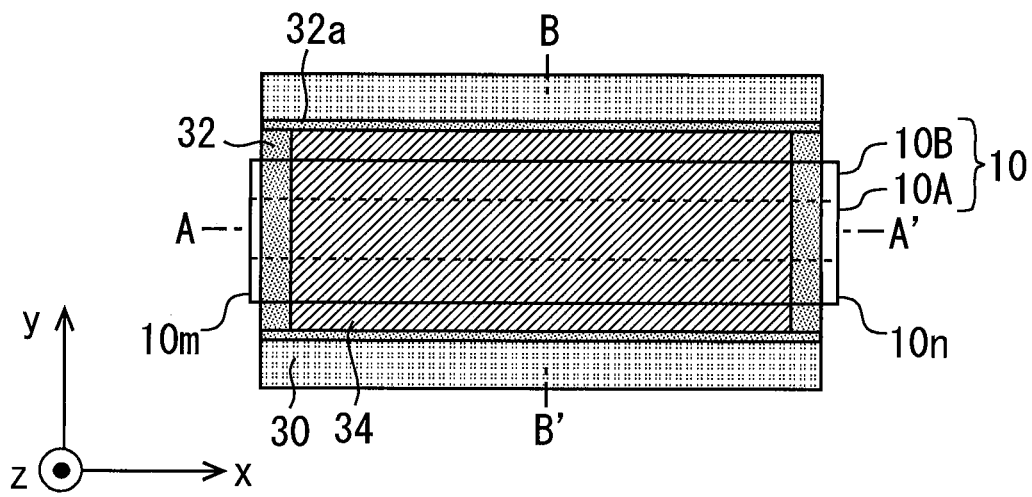
FIG. 3A is a plan view of the semiconductor device according to first embodiment.
Figure 3B:
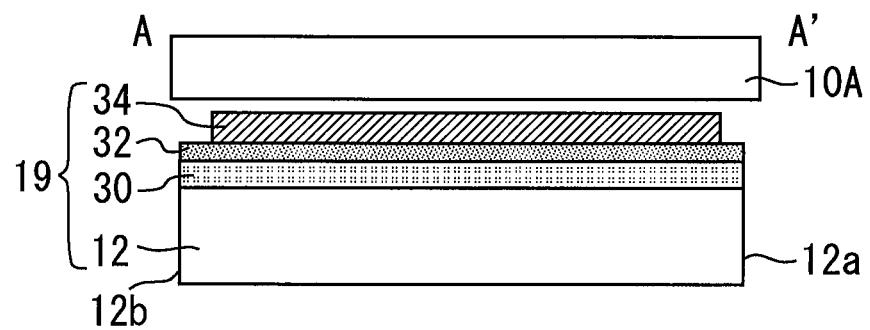
FIG. 3B is a cross-sectional view of the semiconductor device according to first embodiment.
Figure 3C:
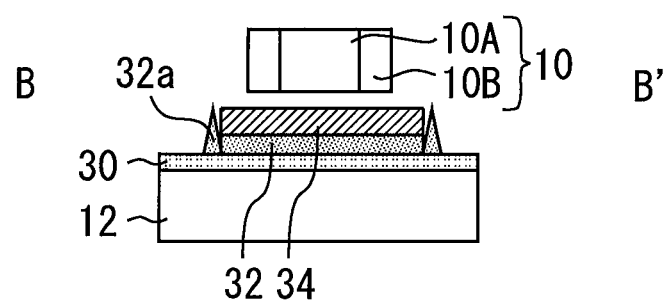
FIG. 3C is a cross-sectional view of the semiconductor device according to first embodiment.

FIGS. 3A, 3B, and 3C are views that show states before the laser chip 10 is soldered to the submount. FIG. 3A is a plan view. In order to make a surface of the submount visible, the laser chip 10 is drawn only in outline. FIG. 3B is a cross-sectional view on line A-A' of FIG. 3A. FIG. 3B is a cross-sectional view in a resonator direction. FIG. 3C is a cross-sectional view on line B-B' of FIG. 3A. FIG. 3C is a cross-sectional view in a direction different from the resonator direction by 90°.

FIG. 3A shows that the laser chip 10 has a front end face 10n and a rear end face 10m. The front end face 10n and the rear end face 10m protrude more than a submount substrate; however, end faces of the submount substrate may be located directly below the front end face 10n and the rear end face 10m.

With reference to FIG. 3B, the submount 19 will be described. The submount 19 includes: a submount substrate 12; an electrode layer 30 provided on the submount substrate 12; a barrier layer 32 provided on the electrode layer 30; and solder 34 in contact with the barrier layer 32.

The material of the submount substrate 12 is, for example, SiC. The submount substrate 12 has a first end face 12a and a second end face 12b opposite to the first end face 12a. The electrode layer 30 is a layer provided on the laser chip 10 side of the submount substrate 12. The electrode layer 30 includes, for example, Ti, Ta, Mo, Pt, or Au. Any one of Ti, Ta, Mo, Pt, and Au may form the electrode layer 30. The electrode layer 30 can be formed on an entire upper face of the submount substrate 12.

The barrier layer 32 extends up to directly above the first end face 12a and the second end face 12b, as shown in FIG. 3B. The barrier layer 32 is formed by vapor-deposition of Pt after forming a patterned resist, and then performing lift-off. The lift-off is a process of removing Pt deposited on a resist pattern, together with the resist, thereby leaving Pt deposited outside of the resist pattern. In this lift-off, burrs 32a are generated on a barrier layer on a border of the pattern. Specifically, a resist shape at the time of Pt pattern formation is set so that the burrs 32a on the barrier layer 32 are generated. If the resist thickness is too much, the resist becomes a shadow and since Pt is not deposited on a side face of the resist at the border of the pattern, a burr is not generated. In addition, if the resist thickness is too small, Pt is vapor-deposited on the side of the resist at the border of the pattern; however, Pt deposited outside of the resist pattern, Pt deposited on the side of the resist, and Pt deposited on the resist pattern are connected and therefore lift-off cannot be performed. Therefore, by setting the resist thickness to 1.5 times or more to 4 times or less, more preferably 2 times or more to 3 times or less of a Pt thickness, lift-off becomes possible while forming a burr.

In FIG. 3A, the burrs 32a are shown. Each burr 32a is on a side face of the barrier layer 32. Since the barrier layer 32 extends up to directly above the first end face 12a and the second end face 12b, the burrs 32a are formed above and below the barrier layer 32 in FIG. 3A and not formed on left and right of the barrier layer 32. The barrier layer 32 is formed to extend only to at least one of the first end face 12a or the second end face 12b among end faces of the submount substrate 12 in a plan view. In FIG. 3B, it is shown that the barrier layer 32 extends to the first end face 12a and the second end face 12b among the end faces of the submount substrate 12 in a plan view. In FIG. 3C, it is shown that the barrier layer 32 does not extend to the end faces of the submount substrate 12. The barrier layer 32 extends to neither an end face on an upper side of FIG. 3A nor an end face on a lower side of FIG. 3A, among the end faces of the submount substrate 12.

The solder 34 is formed of, for example, a material such as an AuSn alloy. As shown in FIG. 3A, the solder 34 is provided on the barrier layer 32 so as to be set back from all the end faces of the submount substrate in a plan view. In FIG. 3B, the solder 34 is shown which is provided in a position set back from the end faces of the submount 19 in the resonator direction. In FIG. 3C, the solder 34 is shown which is provided in a position set back from the end faces of the submount substrate 12 in a direction different from the resonator direction by 90°. By providing the solder 34 in a position set back from the end faces of the submount substrate, a solder burr at the time of cutting the submount can be prevented. Since the height of a solder burr generated by solder cutting is as large as several tens of μm, a defect such as light blocking due to the solder burr may occur; and therefore, the solder burr is avoided. On the other hand, since the height of the burr 32a of the barrier layer 32 generated by the submount cutting is as small as several μm, there is no problem even if they are generated. The difference between the height of the solder burr and the height of the burr 32a of the barrier layer is caused because the solder 34 is soft and extends at the time of cutting but the Pt barrier layer 32 is hard and does not extend at the time of cutting.

In FIG. 3C, it is shown that the burrs 32a are formed higher than the barrier layer 32. In FIG. 3C, the solder 34 is located between the burrs 32a. Therefore, the solder 34 is prevented from wetly spreading in a direction different from the resonator direction by 90°, so that a wire bonding area where the electrode layer 30 is exposed can be secured. Thus, in a y direction which is a direction different from the resonator direction by 90°, both the barrier layer 32 and the solder 34 are formed on an inner side than ends of the submount substrate 12 and in addition, the wet spreading of the solder is prevented by the burrs 32a. As for an x direction that is the resonator direction, the barrier layer 32 is present up to submount ends, and the solder 34 is formed on an inner side than the submount ends.

The thickness of the submount substrate 12 is 100 to 300 μm, and the thickness of the electrode layer 30 is 0.1 to 1.0 μm. The width of the submount substrate 12 and the electrode layer 30 is 800 to 1200 μm. The width refers to a length in the y direction in FIG. 3A. The thickness of the barrier layer 32 is 0.1 to 1.0 μm. The thickness of the solder 34 is 0.5 to 10 μm. The thickness of the solder 34 is 500 to 900 μm.

In the method for manufacturing a semiconductor device according to the first embodiment, such a submount 19 is first prepared. In FIGS. 3B, 3C, and 3D, a state immediately before the laser chip 10 is mounted on the submount 19 is shown.

Figure 4A:
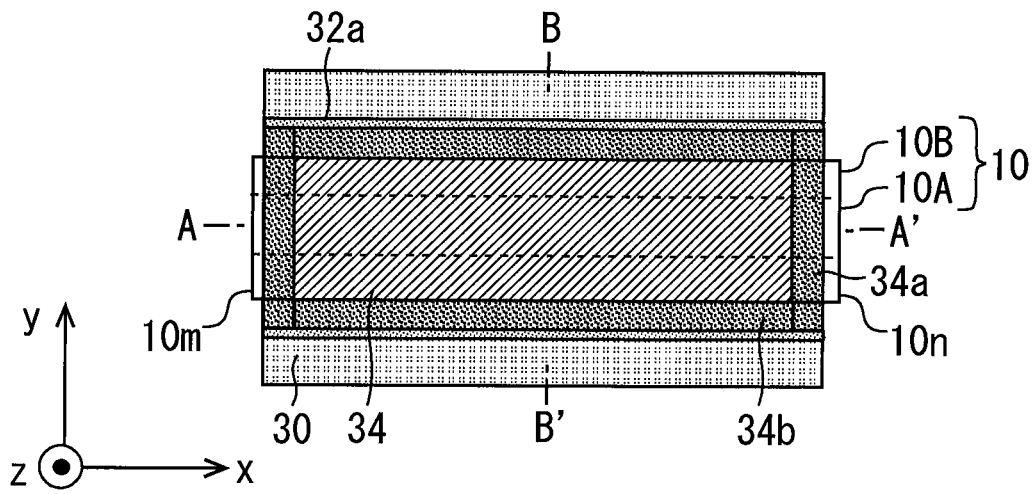
FIG. 4A is a plan view of the semiconductor device according to first embodiment.
Figure 4B:
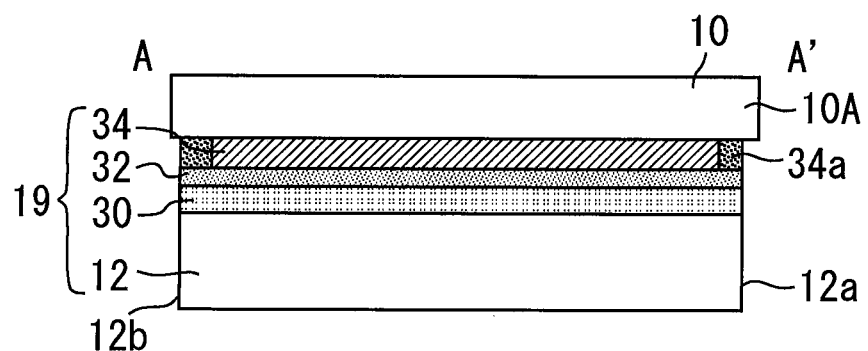
FIG. 4B is a cross-sectional view of the semiconductor device according to first embodiment.
Figure 4C:
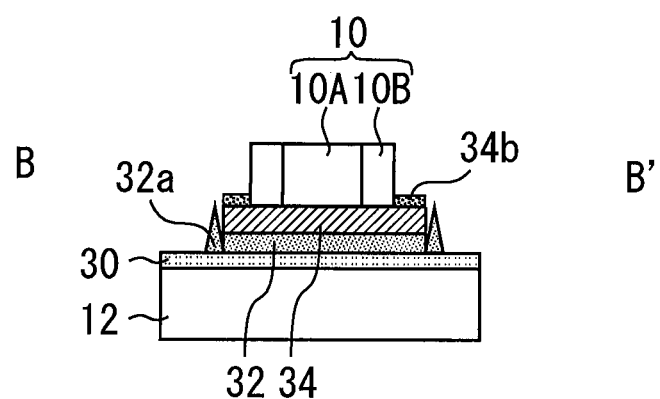
FIG. 4C is a cross-sectional view of the semiconductor device according to first embodiment.

FIGS. 4A, 4B, and 4C are views that show states after the laser chip 10 is soldered to the submount 19. FIG. 4A is a plan view. FIG. 4B is a cross-sectional view on line A-A' of FIG. 4A. FIG. 4B is a cross-sectional view in the resonator direction. FIG. 4C is a cross-sectional view on line B-B' of FIG. 4A. FIG. 4C is a cross-sectional view in a direction different from the resonator direction by 90°.

In the method for manufacturing a semiconductor device according to the first embodiment, as shown in FIG. 4B, the laser chip 10 is placed on the solder 34 and the laser chip 10 is positioned directly above the first end face 12a and directly above the second end face 12b. Next, the solder 34 is heated. In FIG. 4A, it is shown that the solder wetly spreads because of the heating to form extending parts 34a and 34b. The extending part 34a is formed by the wet spreading of the solder in the resonator direction. In FIG. 4B, it is shown that the solder 34 wetly spreads toward the first end face 12a and the second end face 12b to form the extending part 34a, so that the extending part 34a directly connects the laser chip 10 and the barrier layer 32. The extending part 34a extends to the first end face 12a and the second end face 12b in a plan view. The extending part 34a connects an end part of the light emitting stripe region 10A and an end part of the barrier layer 32, thereby enhancing the heat dissipation of the laser chip 10. Although the provision of the extending part 34a, itself, contributes to the improvement of heat dissipation, high heat dissipation can be provided when the extending part 34a is brought into contact with the end or its vicinity of the laser chip 10. In FIG. 4B, the extending part 34a exists on both the first end face 12a side and the second end face 12b side; however, the extending part 34a may exist only on either one.

The extending part 34b is formed by extension of the solder 34 in a z positive direction of FIG. 4A along the laser chip 10. In FIG. 4A, the wet spreading of the solder 34 in a y positive and negative direction is prevented by the burrs 32a. In this manner, the heated solder 34 wetly spreads toward the first end face 12a or the second end face 12b under restriction on the wet spreading by the burrs 32a, to form the extending part 34a, so that the extending part 34a directly connects the laser chip 10 and the barrier layer 32.

Since the barrier layer 32 of the first embodiment exists up to the submount ends in the resonator direction, lift-off of the barrier layer 32 in the resonator direction is not performed and burrs are not generated. That is, there is no burr in the x positive and negative direction of the barrier layer 32. Therefore, the solder 34 wetly spreads in the resonator direction without being restricted by burrs, to form the extending parts 34a. The extending parts 34a are in contact with the ends or their vicinities of the laser chip 10, to enhance the heat dissipation of the laser chip 10.

Figure 5A:
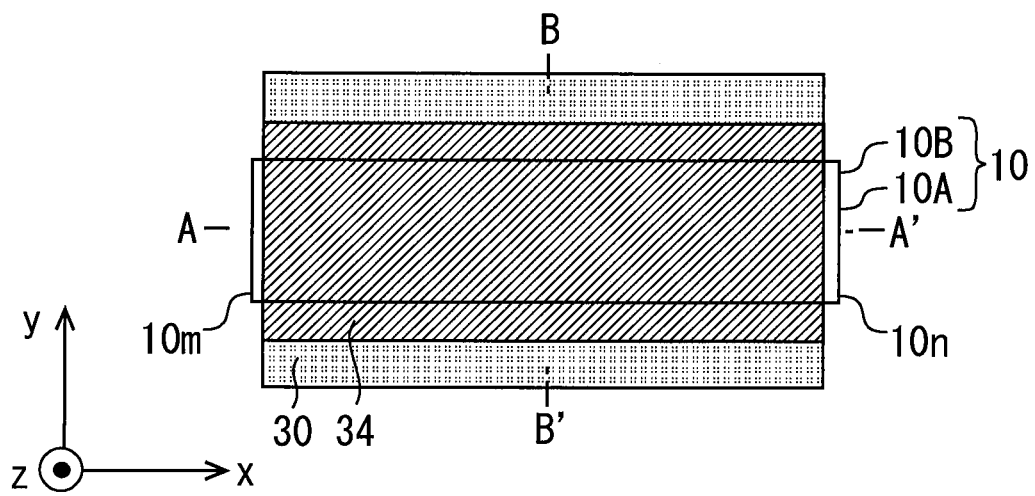
FIG. 5A is a plan view of a semiconductor device of the first comparative example.
Figure 5B:
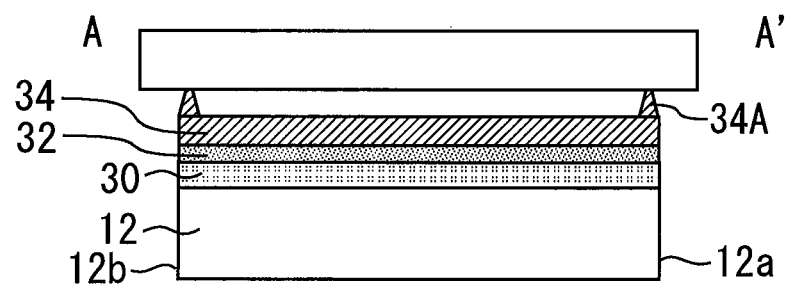
FIG. 5B is a cross-sectional view of a semiconductor device of the first comparative example.
Figure 5C:
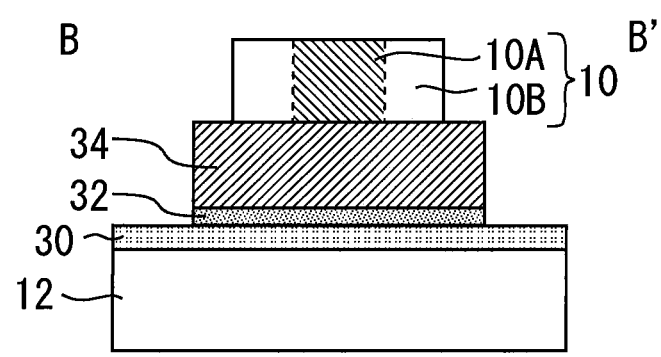
FIG. 5C is a cross-sectional view of a semiconductor device of the first comparative example.

Here, a first comparative example will be described. FIGS. 5A, 5B, and 5C are views that show states after a laser chip is mounted in the first comparative example. FIG. 5A is a plan view of a semiconductor device of the first comparative example. FIG. 5B is a cross-sectional view on line A-A' of FIG. 5A. FIG. 5C is a cross-sectional view on line B-B' of FIG. 5A. In FIGS. 5A and 5B, it is shown that the solder 34 extends to directly above end faces of the submount 19. In this case, solder burrs 34A may be generated when the submount is cut, thereby causing the deterioration of characteristics or reducing reliability.

Figure 6A:
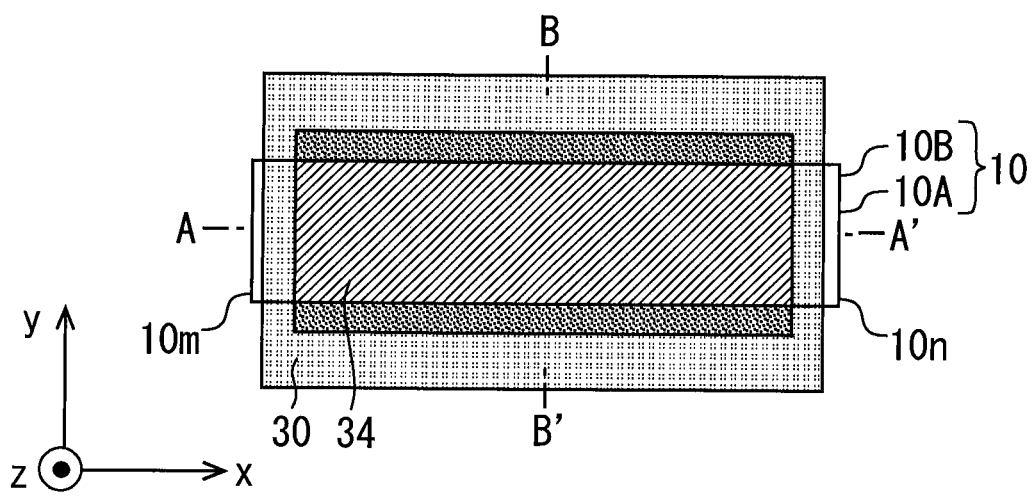
FIG. 6A is a plan view of a semiconductor device of the second comparative example.
Figure 6B:
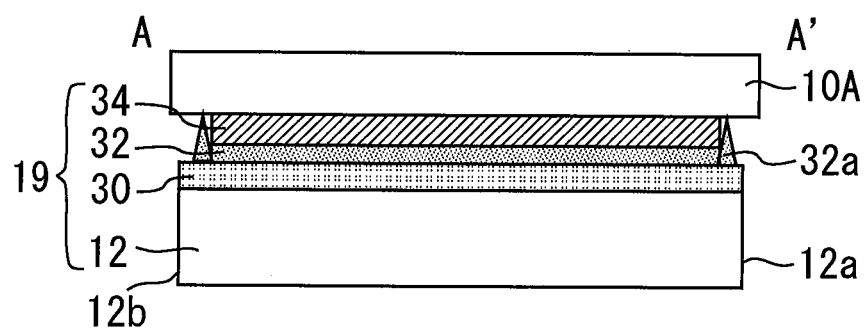
FIG. 6B is a cross-sectional view of a semiconductor device of the second comparative example.
Figure 6C:
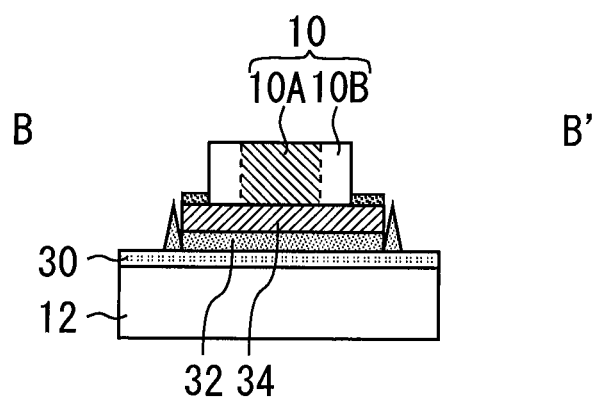
FIG. 6C is a cross-sectional view of a semiconductor device of the second comparative example.

Next, a second comparative example will be described. FIGS. 6A, 6B, and 6C are views that show states after a laser chip is mounted in the second comparative example. FIG. 6A is a plan view of a semiconductor device of the second comparative example. FIG. 6B is a cross-sectional view on line A-A' of FIG. 6A. FIG. 6C is a cross-sectional view on line B-B' of FIG. 6A. In FIG. 6A, it is shown that the solder 34 is provided only in a position set back from ends of a submount substrate. In FIG. 6B, it is shown that the solder 34 is sandwiched between the two burrs 32a in the resonator direction. In this case, the wet spreading of the solder 34 in the resonator direction is prevented, so that the solder cannot be brought into contact with ends or their vicinities of the laser chip.

In the method for manufacturing a semiconductor device of the present embodiment, as described above, the solder 34 is made to be set back from all the end faces of the submount 19 and the direction of wet spreading of the solder 34 is controlled by the burrs 32a of the barrier layer 32, thereby not causing the problems in the first comparative example and the second comparative example.

The manufacturing method for a semiconductor device of the present embodiment can be variously modified without losing its features. The specific materials and numerical values described above are all illustrative. For example, in the present embodiment, description has been made such that the submount substrate 12 is made of SiC, the solder 34 is made of an alloy of Au and Sn, and the electrode layer 30 is made of Ti, Ta, Mo, Pt, Au, or the like; however, other materials may be used. Furthermore, the material of the barrier layer 32 has been assumed to be Pt; however, a barrier layer made of a material other than Pt can be used as long as burrs are set up in a final structure. Other than Pt, for example, Ni, Cu, Pd, Co, or the like may be used.

Modifications described in the first embodiment can be applied to methods for manufacturing a semiconductor device according to the following embodiments. Methods for manufacturing a semiconductor device according to the following embodiments have a lot of similarities to the first embodiment and therefore, differences from the first embodiment will be mainly described.

Second Embodiment

Figure 7A:
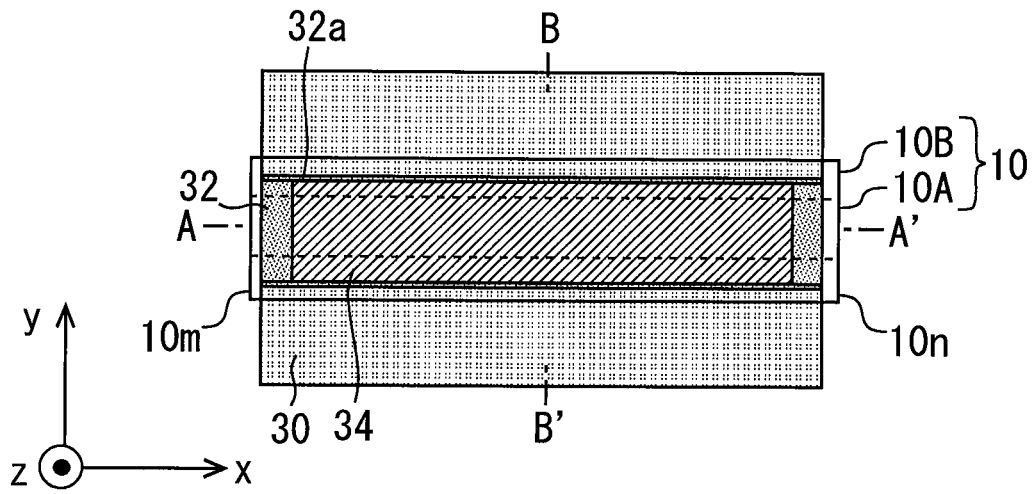
FIG. 7A is a plan view of the semiconductor device according to second embodiment.
Figure 7B:
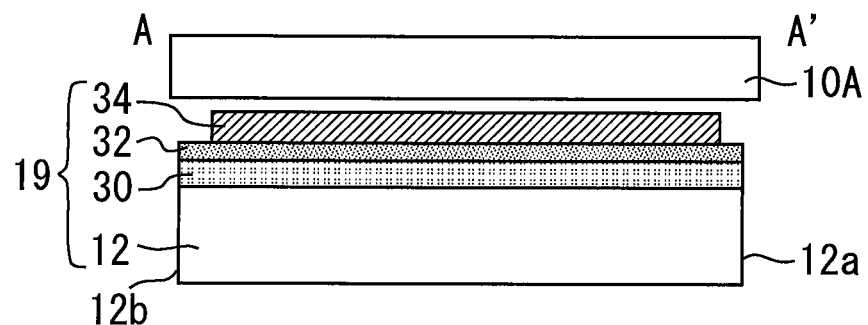
FIG. 7B is a cross-sectional view of the semiconductor device according to second embodiment.
Figure 7C:
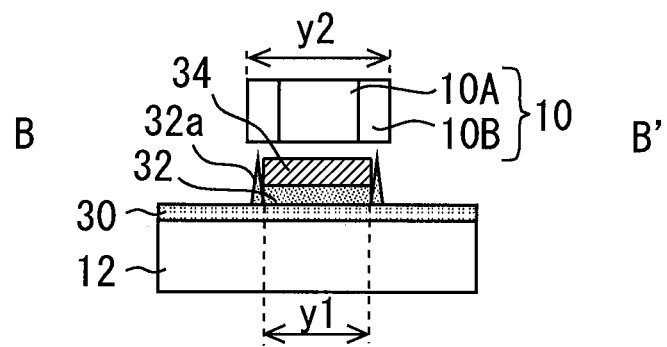
FIG. 7C is a cross-sectional view of the semiconductor device according to second embodiment.

A second embodiment will be described with reference to FIGS. 7A, 7B, and 7C, and FIGS. 8A, 8B, and 8C. FIGS. 7A, 7B, and 7C are views that show states before the laser chip 10 is soldered to the submount 19. FIG. 7A is a plan view. FIG. 7B is a cross-sectional view on line A-A' of FIG. 7A. FIG. 7B is a cross-sectional view in the resonator direction. FIG. 7C is a cross-sectional view on line B-B' of FIG. 7A. FIG. 7C is a cross-sectional view in a direction different from the resonator direction by 90°.

A direction orthogonal to the resonator direction of the laser chip 10 is referred to as an orthogonal direction. The orthogonal direction is a y direction. In the second embodiment, the lengths of the barrier layer 32 and the solder 34 in the orthogonal direction are set to be equal to or less than the length of the laser chip 10 in the orthogonal direction. In FIG. 7C, it is shown that the length y1 of the barrier layer 32 and the solder 34 in the orthogonal direction is set to be equal to or less than the length y2 of the laser chip 10 in the orthogonal direction.

Figure 8A:
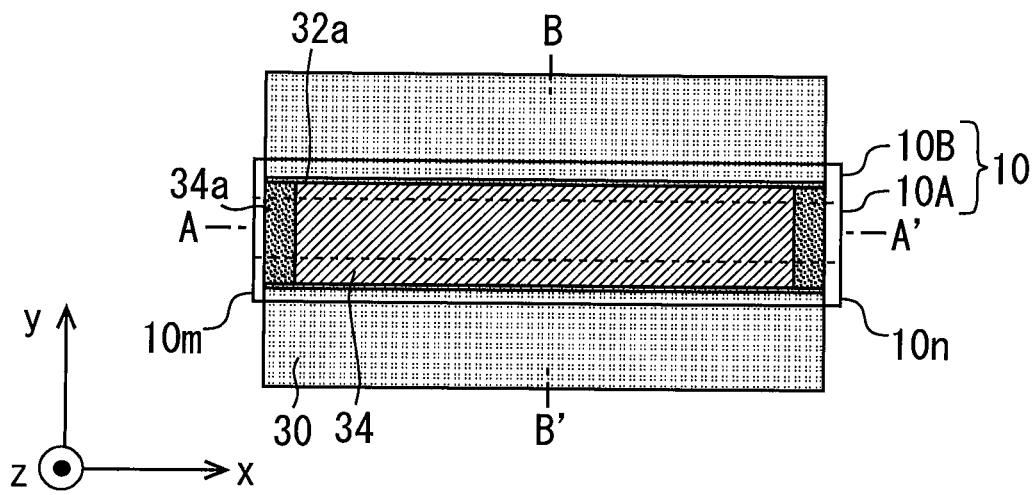
FIG. 8A is a plan view of the semiconductor device according to second embodiment.
Figure 8B:
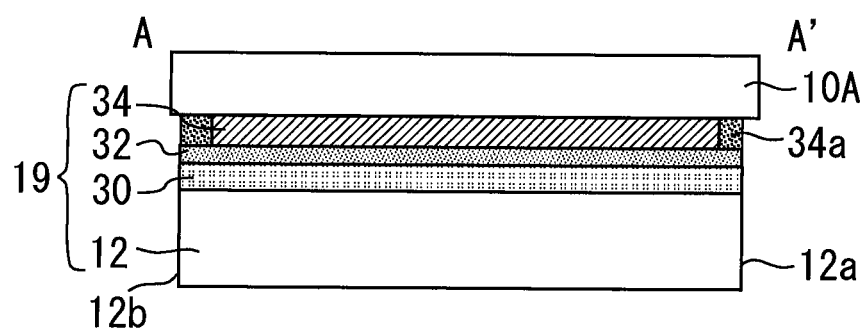
FIG. 8B is a cross-sectional view of the semiconductor device according to second embodiment.
Figure 8C:
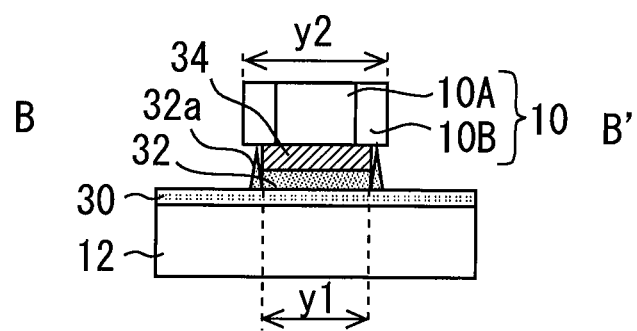
FIG. 8C is a cross-sectional view of the semiconductor device according to second embodiment.

FIGS. 8A, 8B, and 8C are views that show states after the laser chip 10 is soldered to the submount 19. FIG. 8A is a plan view. FIG. 8B is a cross-sectional view on line A-A' of FIG. 8A. FIG. 8B is a cross-sectional view in the resonator direction. FIG. 8C is a cross-sectional view on line B-B' of FIG. 8A. FIG. 8C is a cross-sectional view in a direction different from the resonator direction by 90°. As described above, by setting the length of the solder 34 in the orthogonal direction to be equal to or less than the length of the laser chip 10, the wet spreading of the solder 34 in the orthogonal direction can be prevented. Therefore, the solder 34 can wetly spread more easily on a front end face 10n or rear end face 10m side of the laser chip 10 than in the first embodiment.

Third Embodiment

Figure 9A:
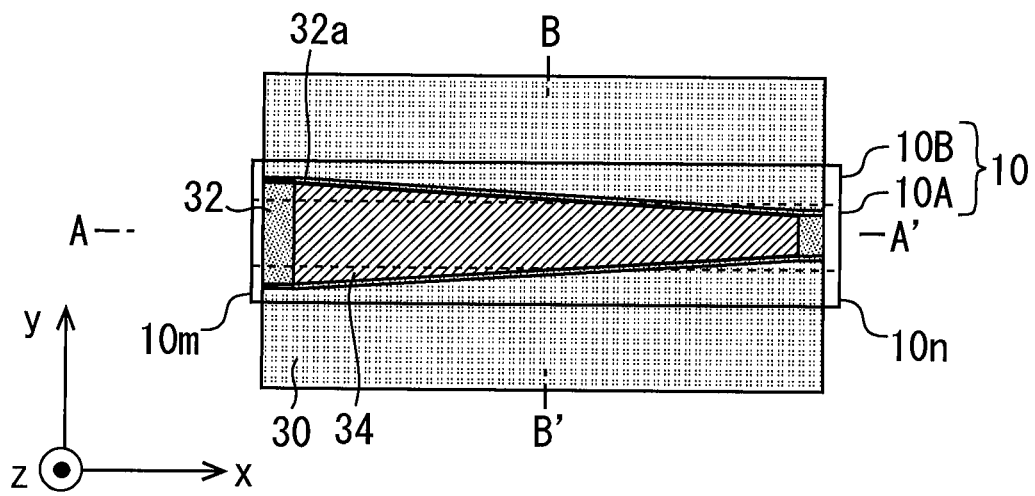
FIG. 9A is a plan view of the semiconductor device according to third embodiment.
Figure 9B:
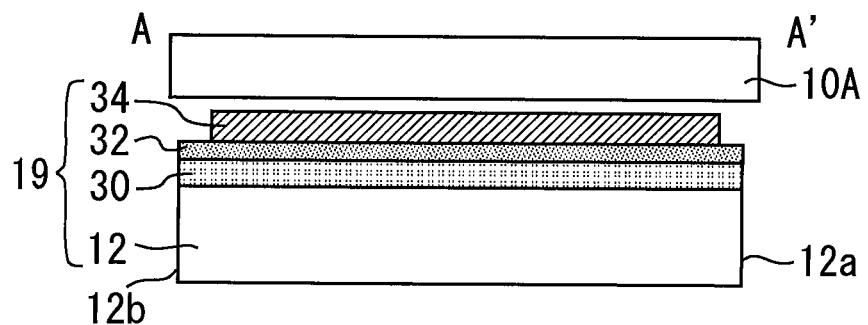
FIG. 9B is a cross-sectional view of the semiconductor device according to third embodiment.
Figure 9C:
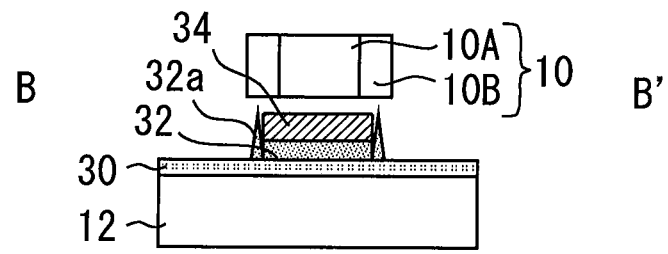
FIG. 9C is a cross-sectional view of the semiconductor device according to third embodiment.

A third embodiment will be described with reference to FIGS. 9A, 9B, and 9C, and FIGS. 10A, 10B, and 10C. FIGS. 9A, 9B, and 9C are views that show states before the laser chip 10 is soldered to the submount 19. FIG. 9A is a plan view. FIG. 9B is a cross-sectional view on line A-A' of FIG. 9A. FIG. 9B is a cross-sectional view in the resonator direction. FIG. 9C is a cross-sectional view on line B-B' of FIG. 9A. FIG. 9C is a cross-sectional view in a direction different from the resonator direction by 90°.

The y direction in FIG. 9A is the orthogonal direction defined earlier. In the third embodiment, the length of the solder 34 in the orthogonal direction is shorter on the front end face 10n side than on the rear end face 10m side. For example, side faces of the solder 34 are inclined with respect to the resonator direction in a plan view. In other words, the solder 34 has a tapered shape whose width decreases toward the front end face 10n side. Furthermore, for example, the orthogonal direction length of the solder 34 on the front end face 10n side can be equal to or less than the width of the light emitting stripe region 10A, and the orthogonal direction length of the solder 34 on the rear end face 10m side can be equal to or more than the width of the light emitting stripe region 10A.

Figure 10A:
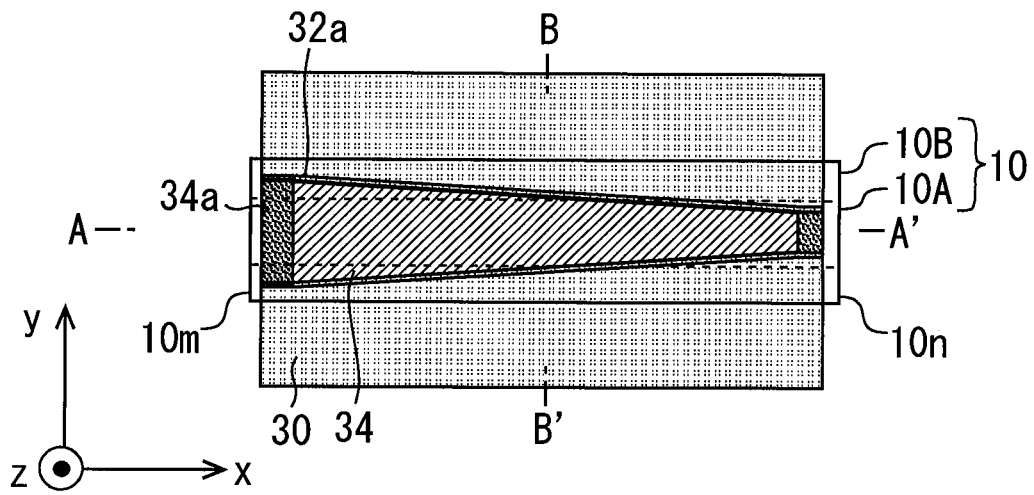
FIG. 10A is a plan view of the semiconductor device according to third embodiment.
Figure 10B:
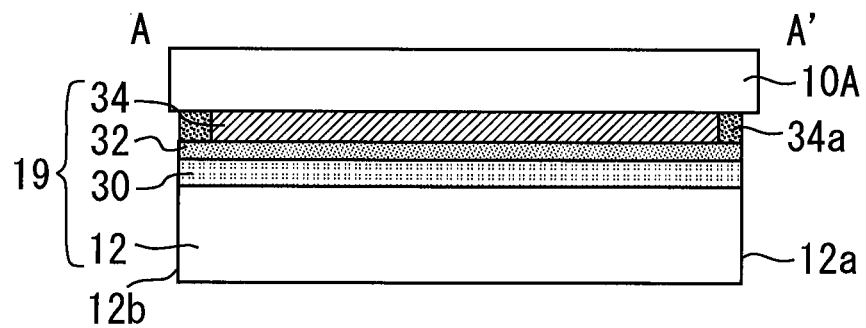
FIG. 10B is a cross-sectional view of the semiconductor device according to third embodiment.
Figure 10C:
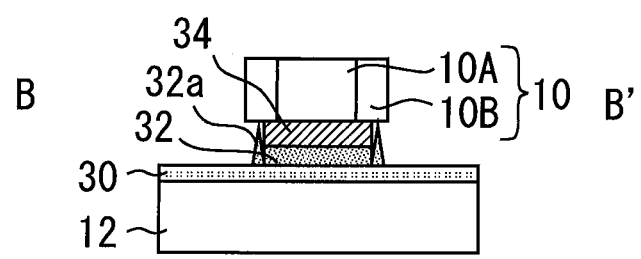
FIG. 10C is a cross-sectional view of the semiconductor device according to third embodiment.

FIGS. 10A, 10B, and 10C are views that show states after the laser chip 10 is soldered to the submount 19. FIG. 10A is a plan view. FIG. 10B is a cross-sectional view on line A-A' of FIG. 10A. FIG. 10C is a cross-sectional view on line B-B' of FIG. 10A. As described above, by making the length of the solder 34 in the orthogonal direction shorter on the front end face 12n side than on the rear end face 12m side, the solder 34 wetly spreads easily toward the front end face 10n. Thus, the front end face 10n side of the laser chip and the barrier layer 32 can be connected by the extending part 34a; and therefore, an improvement in characteristics due to an enhancement of heat dissipation at the front end face 10n of the laser chip 10 becomes possible.

In the third embodiment, the length of the solder in the orthogonal direction is made shorter on the front end face 10n side of the laser chip 10; however, conversely, the length of the solder 34 in the orthogonal direction may be made shorter on the rear end face 10m side of the laser chip 10. In this case, the rear end face 10m side of the laser chip 10 and the barrier layer 32 can be connected by the extending part 34a; and therefore, heat dissipation on the rear end face 10m side can be enhanced. Therefore, it is only required that the length of the solder 34 in the orthogonal direction decreases from one of the first end face 12a side and the second end face 12b side toward the other. In addition, by making the length of one end of the solder 34 in the orthogonal direction shorter than the length of the light emitting stripe region 10A in the orthogonal direction and making the length of the other end of the solder 34 in the orthogonal direction longer than the length of the light emitting stripe region 10A in the orthogonal direction, the formation of the extending part 34a toward the front end face 10n or rear end face 10m side can be promoted.

Fourth Embodiment

Figure 11A:
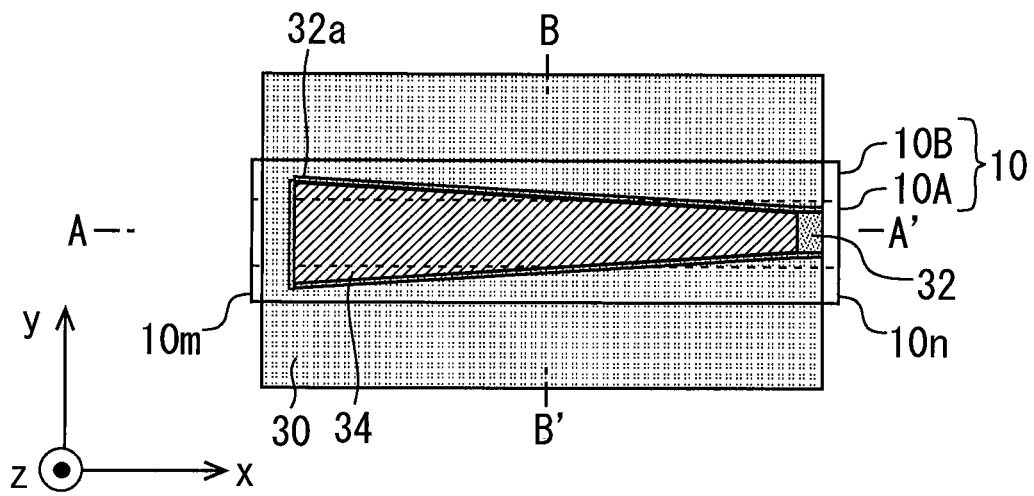
FIG. 11A is a plan view of the semiconductor device according to fourth embodiment.
Figure 11B:
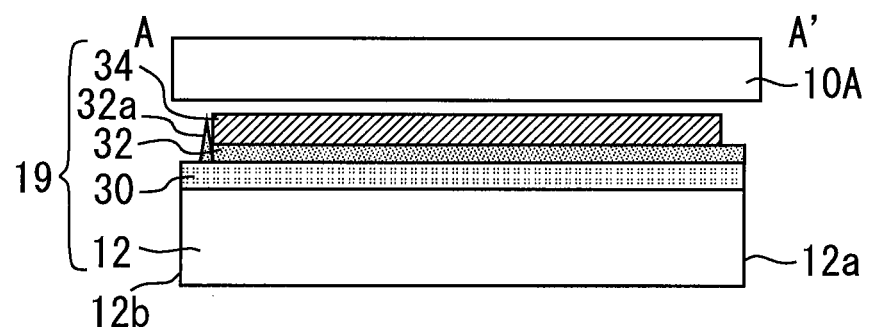
FIG. 11B is a cross-sectional view of the semiconductor device according to fourth embodiment.
Figure 11C:
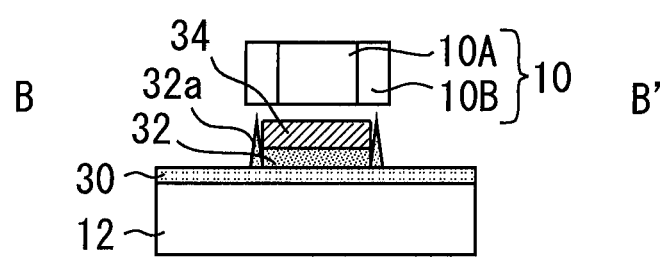
FIG. 11C is a cross-sectional view of the semiconductor device according to fourth embodiment.

A fourth embodiment will be described with reference to FIGS. 11A, 11B, 11C and FIGS. 12A, 12B, and 12C. FIGS. 11A, 11B, and 11C are views that show states before the laser chip 10 is soldered to the submount 19. FIG. 11A is a plan view. FIG. 11B is a cross-sectional view on line A-A' of FIG. 11A. FIG. 11B is a cross-sectional view in the resonator direction. FIG. 11C is a cross-sectional view on line B-B' of FIG. 11A. FIG. 11C is a cross-sectional view in a direction different from the resonator direction by 90°.

As shown in FIGS. 11A and 11B, the barrier layer 32 extends only to the first end face 12a among end faces of the submount substrate 12 in a plan view. Therefore, not only in the y positive and negative direction of the barrier layer 32 and the solder 34 but also between the second end face 12b and the barrier layer 32, the burr 32a is present in a plan view. Thus, on the front end face 10n side, the barrier layer 32 is present up to a submount end in the resonator direction, and the solder 34 is provided on an inner side than the submount end in the resonator direction. On the other hand, on the rear end face 10m side, both the barrier layer 32 and the solder 34 are provided on an inner side than a submount end.

In FIG. 11B, it is shown that the barrier layer 32 extends to directly above the first end face 12a. In addition, between the barrier layer 32 and the second end face 12b, the burr 32a is formed. The burr 32a prevents the solder 34 from wetly spreading toward the rear end face 10m. Therefore, the solder 34 wetly spreads easily toward the front end face 10n.

Figure 12A:
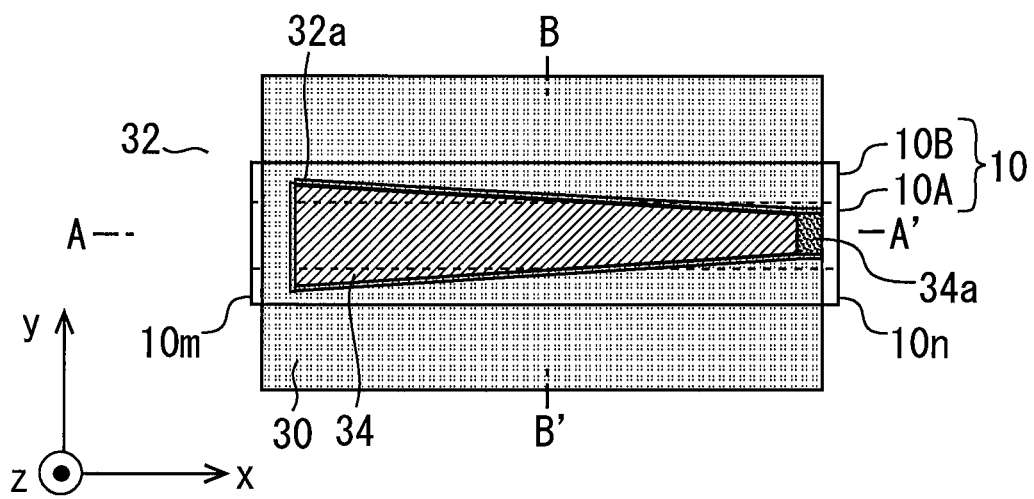
FIG. 12A is a plan view of the semiconductor device according to fourth embodiment.
Figure 12B:
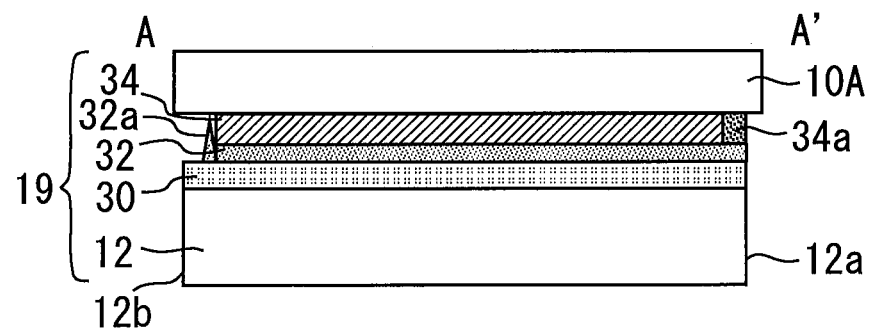
FIG. 12B is a cross-sectional view of the semiconductor device according to fourth embodiment.
Figure 12C:
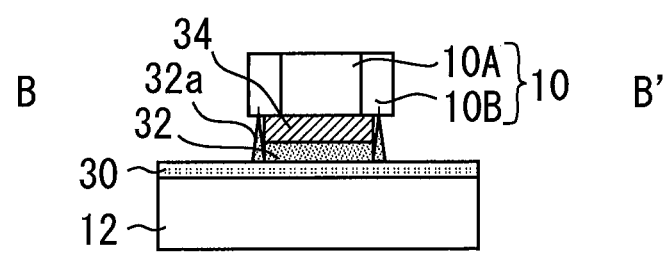
FIG. 12C is a cross-sectional view of the semiconductor device according to fourth embodiment.

FIGS. 12A, 12B, and 12C are views that show states after the laser chip 10 is soldered to the submount 19. FIG. 12A is a plan view. FIG. 12B is a cross-sectional view on line A-A' of FIG. 12A. FIG. 12C is a cross-sectional view on line B-B' of FIG. 12A. As described above, the burr 32a is formed on the rear end face 10m side of the barrier layer 32 and therefore, the solder 34 is prevented from wetly spreading toward the rear end face 10m by the burr 32a. Then, the wet spreading of the solder 34 to the front end face 10n side is promoted, so that the extending part 34a is formed. Furthermore, as described in the third embodiment, by providing the solder 34 so as to make its length in the orthogonal direction decrease toward the front end face 10n side, the wet spreading of the solder 34 to the front end face 10n side is further promoted.

It should be noted that the characteristics of the embodiments described above can be combined.

DESCRIPTION OF SYMBOLS 10 laser chip, 12 submount substrate, 19 submount, 30 electrode layer, 32 barrier layer, 34 solder

The invention claimed is:

1. A method for manufacturing a semiconductor device, comprising:
    preparing a submount, the submount including a submount substrate having a first end face and a second end face opposite to the first end face, an electrode layer provided on the submount substrate, a barrier layer provided on the electrode layer, the barrier layer extending to only at least one of the first end face and the second end face among end faces of the submount substrate in a plan view, a burr provided on a side face of the barrier layer and higher than the barrier layer, and solder provided on the barrier layer so as to be set back from all the end faces of the submount substrate in a plan view;
    placing a laser chip on the solder, the laser chip having a light emitting stripe region and adjacent regions on left and right of the light emitting stripe region, and positioning the laser chip directly above the first end face and directly above the second end face; and
    heating the solder to wetly spread toward the first end face or the second end face under restriction on the wet spreading by the burr to form an extending part, so that the extending part directly connects the laser chip and the barrier layer, wherein
    a length of the solder in an orthogonal direction decreases from one of a first end face side and a second end face side toward another, the orthogonal direction being a direction orthogonal to a resonator direction of the laser chip.

2. The method for manufacturing a semiconductor device according to claim 1, wherein
    the barrier layer extends to the first end face and the second end face in a plan view and the extending part extends to the first end face and the second end face in a plan view.

3. The method for manufacturing a semiconductor device according to claim 1, wherein
    lengths of the barrier layer and the solder in an orthogonal direction are equal to or less than a length of the laser chip in the orthogonal direction, the orthogonal direction being a direction orthogonal to a resonator direction of the laser chip.

4. The method for manufacturing a semiconductor device according to claim 1, wherein
    a length of one end of the solder in the orthogonal direction is shorter than a length of the light emitting stripe region in the orthogonal direction; and a length of another end of the solder in the orthogonal direction is longer than the length of the light emitting stripe region in the orthogonal direction.

5. The method for manufacturing a semiconductor device according to claim 1, wherein
    the barrier layer extends only to the first end face among end faces of the submount substrate in a plan view; and the burr exists between the second end face and the barrier layer in a plan view.

6. The method for manufacturing a semiconductor device according to claim 1, wherein
the barrier layer is formed by a lift-off method; and the burr is generated in the lift-off.

7. A method for manufacturing a semiconductor device, comprising:
preparing a submount, the submount including a submount substrate having a first end face and a second end face opposite to the first end face, an electrode layer provided on the submount substrate, a barrier layer provided on the electrode layer, the barrier layer extending to only at least one of the first end face and the second end face among end faces of the submount substrate in a plan view, a burr provided on a side face of the barrier layer and higher than the barrier layer, and solder provided on the barrier layer so as to be set back from all the end faces of the submount substrate in a plan view;
placing a laser chip on the solder, the laser chip having a light emitting stripe region and adjacent regions on left and right of the light emitting stripe region, and positioning the laser chip directly above the first end face and directly above the second end face; and
heating the solder to wetly spread toward the first end face or the second end face under restriction on the wet spreading by the burr to form an extending part, so that the extending part directly connects the laser chip and the barrier layer, wherein
the barrier layer extends only to the first end face among end faces of the submount substrate in a plan view;
the burr exists between the second end face and the barrier layer in a plan view; and
a length of the solder in an orthogonal direction decreases toward a first end face side, the orthogonal direction being a direction orthogonal to a resonator direction of the laser chip.

8. The method for manufacturing a semiconductor device according to claim 2, wherein the barrier layer is formed by a lift-off method; and the burr is generated in the lift-off.

9. The method for manufacturing a semiconductor device according to claim 3, wherein the barrier layer is formed by a lift-off method; and the burr is generated in the lift-off.

10. The method for manufacturing a semiconductor device according to claim 4, wherein the barrier layer is formed by a lift-off method; and the burr is generated in the lift-off.

11. The method for manufacturing a semiconductor device according to claim 5, wherein the barrier layer is formed by a lift-off method; and the burr is generated in the lift-off.

12. The method for manufacturing a semiconductor device according to claim 6, wherein the barrier layer is formed by a lift-off method; and the burr is generated in the lift-off.

13. The method for manufacturing a semiconductor device according to claim 7, wherein the barrier layer is formed by a lift-off method; and the burr is generated in the lift-off.

14. The method for manufacturing a semiconductor device according to claim 2, wherein
lengths of the barrier layer and the solder in an orthogonal direction are equal to or less than a length of the laser chip in the orthogonal direction, the orthogonal direction being a direction orthogonal to a resonator direction of the laser chip.

\* \* \* \* \*